(12) United States Patent
Huang

(10) Patent No.: US 7,254,042 B2
(45) Date of Patent: Aug. 7, 2007

(54) ELECTRO MAGNETIC INTERFERENCE SHIELDING DEVICE AND A LIQUID CRYSTAL DISPLAY DEVICE ADOPTING SAME

(75) Inventor: Lan Huang, Tu-Cheng (TW)

(73) Assignee: Hon Hai Precision Industry Co., Ltd., Tu-Cheng, Taipei Hsien (TW)

( * ) Notice: Subject to any disclaimer, the term of this patent is extended or adjusted under 35 U.S.C. 154(b) by 0 days.

(21) Appl. No.: 11/228,639

(22) Filed: Sep. 16, 2005

(65) Prior Publication Data

US 2006/0146511 A1    Jul. 6, 2006

(30) Foreign Application Priority Data

Dec. 30, 2004    (CN) .................... 2004 1 0091962

(51) Int. Cl.
  *H05K 9/00*    (2006.01)
(52) U.S. Cl. .............. 361/818; 361/800; 361/816; 361/753; 174/350; 174/384; 174/377
(58) Field of Classification Search ........... 361/800, 361/816, 818, 753, 799, 730, 728, 752; 174/350, 174/351, 377, 384
See application file for complete search history.

(56) References Cited

U.S. PATENT DOCUMENTS

| | | | |
|---|---|---|---|
| 5,260,601 A * | 11/1993 | Baudouin et al. ........... 257/678 |
| 6,324,558 B1 * | 11/2001 | Wilber ......................... 708/255 |
| 6,469,248 B1 * | 10/2002 | Rehnelt et al. .............. 174/388 |
| 6,552,261 B2 * | 4/2003 | Shlahtichman et al. ...... 174/384 |
| 6,862,066 B2 * | 3/2005 | Oowaki et al. .............. 349/139 |
| 7,077,543 B2 * | 7/2006 | Nishiyama et al. .......... 362/225 |
| 7,098,903 B2 * | 8/2006 | Park et al. ................... 345/211 |
| 2002/0075253 A1 * | 6/2002 | Park et al. ................... 345/211 |
| 2003/0107881 A1 * | 6/2003 | Muramatsu et al. ......... 361/818 |

* cited by examiner

*Primary Examiner*—Dean A. Reichard
*Assistant Examiner*—Dameon E. Levi
(74) *Attorney, Agent, or Firm*—Jeffrey T. Knapp

(57) ABSTRACT

An Electro Magnetic Interference (EMI) shielding device (20) includes a body (201), at least a first engaging portion (203) extending from the body, and a pair of second engaging portions (205) formed on the body. A liquid crystal display device adopting the above mentioned EMI shielding device includes a TFT LCD panel, a power supply (12), an inverter (14) and an interface board (13). The power supply, the inverter and the interface board are formed on a printed circuit board (10). The EMI shielding device is positioned between the power supply and the inverter, with the first engaging portion inserted into the printed circuit board and the second engaging portions engaging with the printed circuit board. The EMI shielding device can reduce or potentially avoid the occurrence of EMI that would otherwise be produced by the printed circuit board.

16 Claims, 3 Drawing Sheets

ELECTRO MAGNETIC INTERFERENCE SHIELDING DEVICE AND A LIQUID CRYSTAL DISPLAY DEVICE ADOPTING SAME

BACKGROUND

1. Field of the Invention

The invention relates generally to Electro Magnetic Interference (EMI) shielding devices and, more particularly, to an EMI shielding device used in liquid crystal display devices and a liquid crystal display device adopting same.

2. Discussion of the Related Art

Liquid crystal display (LCD) devices have many excellent performances, such as large-scale information displaying, low power consumption, easy to color, long life, no pollution and so on. Therefore, the liquid crystal display devices are used widely. A typical liquid crystal display device includes a thin film transistor (TFT) LCD panel, a power supply, an inverter and an interface board. Currently, the power supply and the inverter are positioned on a first printed circuit board and the interface board is positioned on a second printed circuit board.

However, the typical liquid crystal display device has the following disadvantages. Firstly, two separate printed circuit boards must be adopted, and this results in more process in the production line thereby increasing manufacturing cost of the liquid crystal display device. Secondly, a harness must be added to connect the power supply and the inverter with the interface board. The connection is prone to fail and thus the typical liquid crystal display device can't work stably.

In order to overcome the above-mentioned disadvantages, the power supply, the inverter and the interface board can be integrated on one printed circuit board, as set forth, at least in part in a related Foxconn application, "A LOW-COST INTEGRATED LIQUID CRYSTAL DISPLAY DEVICE" Ser. No. 11/228,820. The integrated liquid crystal display device saves cost and can work stably. However, a distance between every adjacent pair combination of the power supply, inverter and interface board is relatively small. When the liquid crystal display device is in use, the power supply, inverter and interface board each release electromagnetic waves, respectively, usually resulting in some amount of Electro Magnetic Interference (EMI). The EMI is a challenge, such as bad for the performance of the liquid crystal display device and potentially harmful to humans.

What is needed, therefore, is an EMI shielding device which can reduce or even avoid EMI produced by the integrated printed circuit board of a liquid crystal display device.

What is also needed, therefore, is a liquid crystal display device which can reduce/avoid EMI effectively.

SUMMARY

In one embodiment, an Electro Magnetic Interference (EMI) shielding device includes a body, at least a first engaging portion, and a pair of second engaging portions. The body is in the form of a sheet. The first engaging portion is substantially formed in the middle of the body and extends downwardly therefrom. The first engaging portion is a hollow plate. The second engaging portions are formed on opposite ends of a bottom of the body, respectively. Each second engaging portion is a plate and extends outwardly along a direction perpendicular to the body.

In another embodiment, a liquid crystal display device includes a TFT LCD panel, a power supply, an inverter, an interface board and the above mentioned EMI shielding device. The power supply, the inverter and the interface board are positioned on a printed circuit board. The EMI shielding device is positioned between the power supply and the inverter with the first engaging portion inserted into the printed circuit board and the second engaging portions engaging with the printed circuit board, i.e., contacting a surface of the printed circuit board.

Compared with other liquid crystal display device, the present liquid crystal display device adopts the present EMI shielding device, thereby reducing or even avoiding EMI produced by the integrated printed circuit board thereof. This shielding helps to ensure that the liquid crystal display device has a good performance.

Other advantages and novel features of the present EMI shielding device and the liquid crystal display device employing the same will become more apparent from the following detailed description of preferred embodiments when taken in conjunction with the accompanying drawings.

BRIEF DESCRIPTION OF THE DRAWINGS

Many aspects of the present EMI shielding device and the liquid crystal display device employing the same can be better understood with reference to the following drawings. The components in the drawings are not necessarily to scale, the emphasis instead being placed upon clearly illustrating the principles of the present EMI shielding device and the liquid crystal display device employing the same. Moreover, in the drawings, like reference numerals designate corresponding parts throughout the several views.

Figure 1:
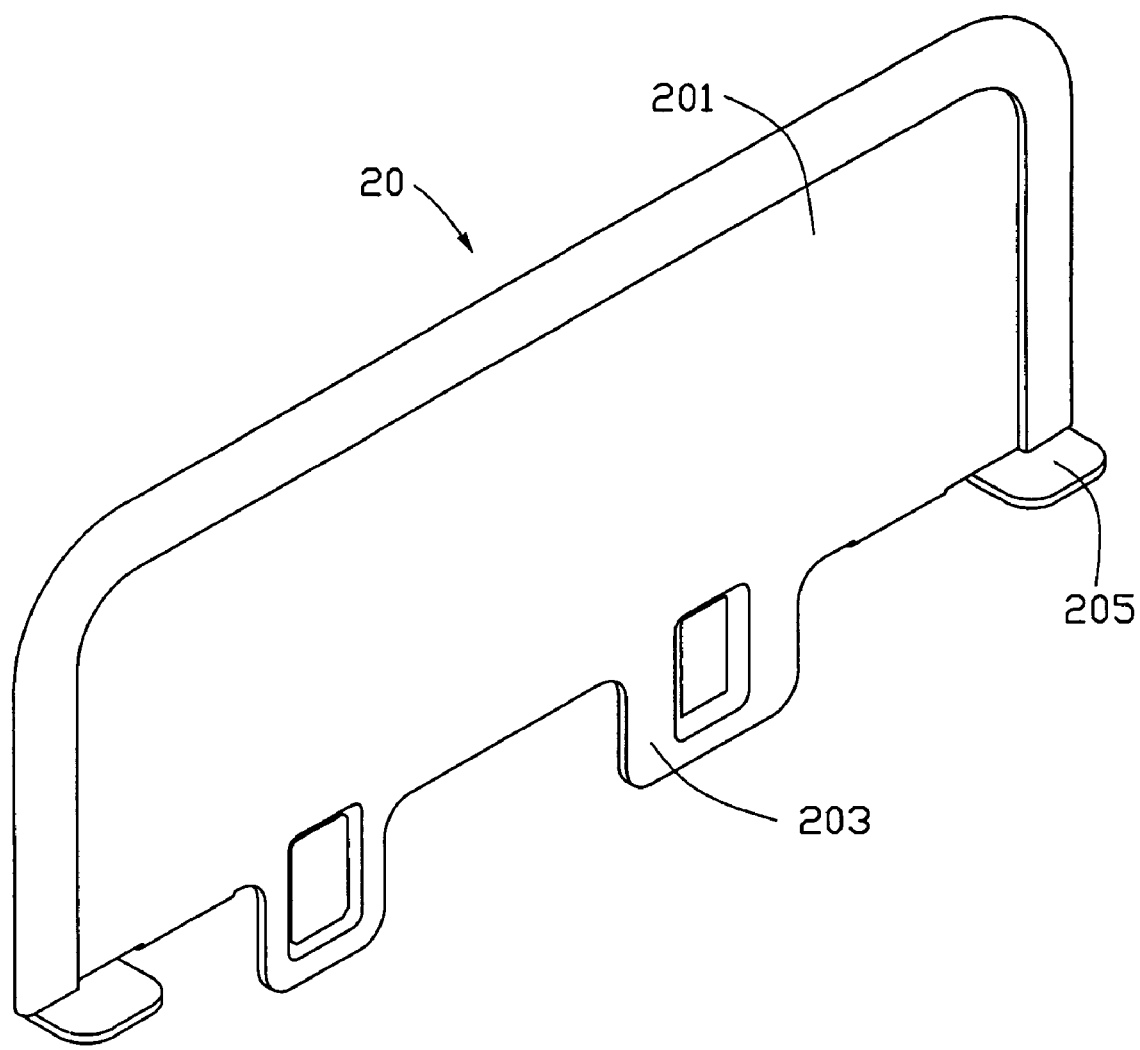
FIG. 1 is an enlarged, isometric view of EMI shielding device in accordance with one embodiment thereof.

Corresponding reference characters indicate corresponding parts throughout the several views. The exemplifications set out herein illustrate at least one preferred embodiment of the invention, in one form, and such exemplifications are not to be construed as limiting the scope of the invention in any manner.

DETAILED DESCRIPTION OF PREFERRED EMBODIMENTS

Reference will now be made to the drawings to describe embodiments of the present EMI shielding device and the liquid crystal display device employing the same in detail.

Referring to FIG. 1, an Electro Magnetic Interference (EMI) shielding device 20 in accordance with one present embodiment includes a body 201, at least a first engaging portion 203, and a pair of second engaging portions 205. The body 201 is in the form of a sheet, and a length and a width thereof are determined according to actual needs (i.e., size of shield needed for sufficient EM blockage). Alternatively, the body 201 can take other appropriate forms. In the embodiment, the EMI shielding device 20 includes a pair of first engaging portions 203. The first engaging portions 203 are substantially formed in the middle of the body 201, the first engaging portions 203 extending downwardly from and being spatially coplanar with the body 201. The first engaging portions 203 are advantageously in the form of hollow plates. The second engaging portions 205 are respectively located on or proximate opposite ends of a bottom of the body 201. Each second engaging portion 205 is a plate and extends outwardly along a direction approximately perpendicular to the body 201. As seen from FIG. 1, the second engaging portions 205 and first engaging portions 203 are formed at a same side of the body 201. The EMI shielding device 20 is made, for example, of tinplate, silicon steel and so on.

Figure 2:
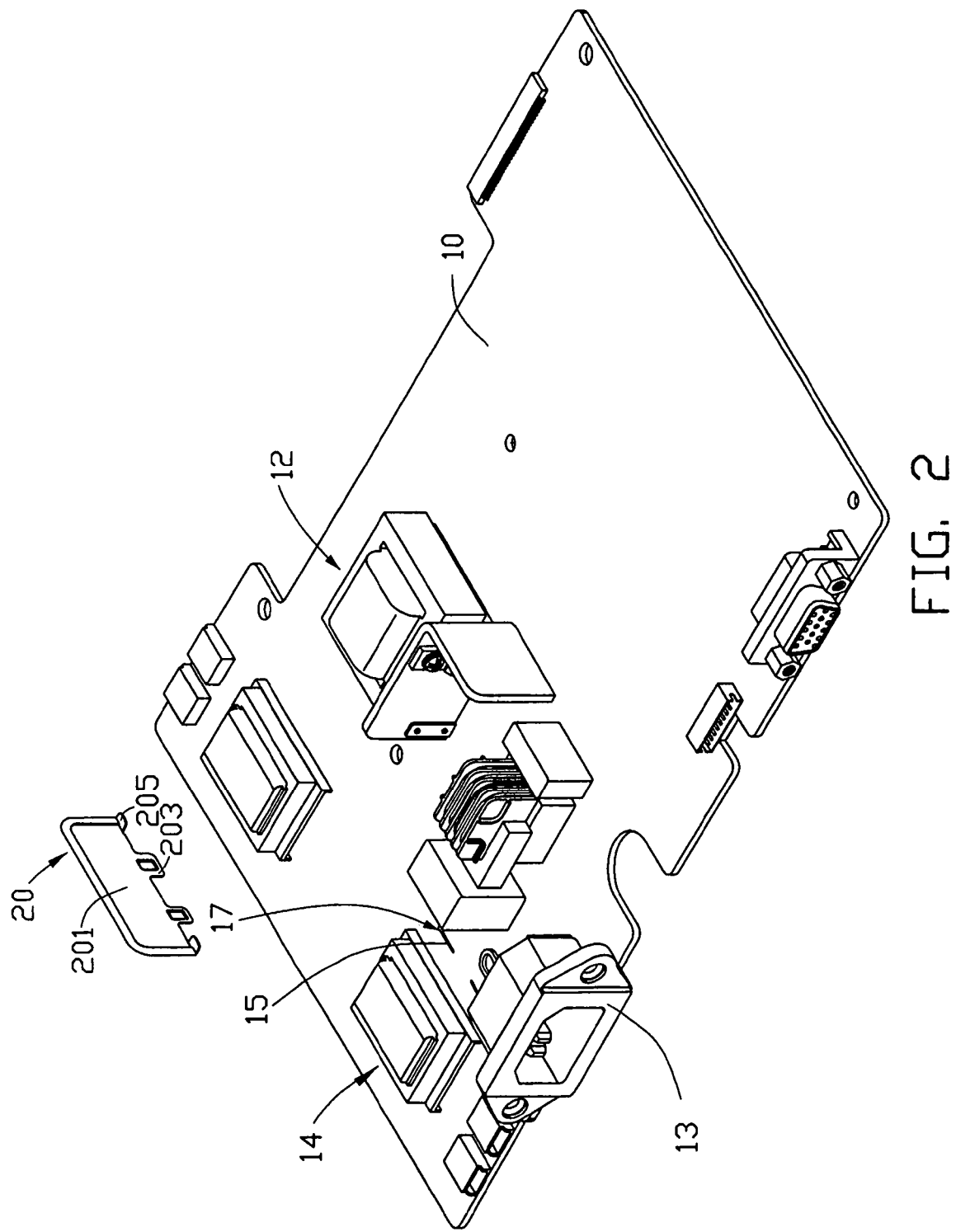
FIG. 2 is an isometric view showing the EMI shielding device of FIG. 1 and a printed circuit board of a liquid crystal display device.

Referring to FIG. 2, a printed circuit board (PCB) 10 of a liquid crystal display device adopting the EMI shielding device 20 is shown. The printed circuit board 10 has a power supply 12, an inverter 14 and an interface board 13 positioned thereon. At least a pair of board recesses 15 is defined in the printed circuit board 20 between the power supply 12 and the inverter 14. The recesses 15 are advantageously near where the interface board 13 is attached on the printed circuit board 10. Furthermore, the recesses 15 can be defined in a grounding plane of the printed circuit board 10.

Figure 3:
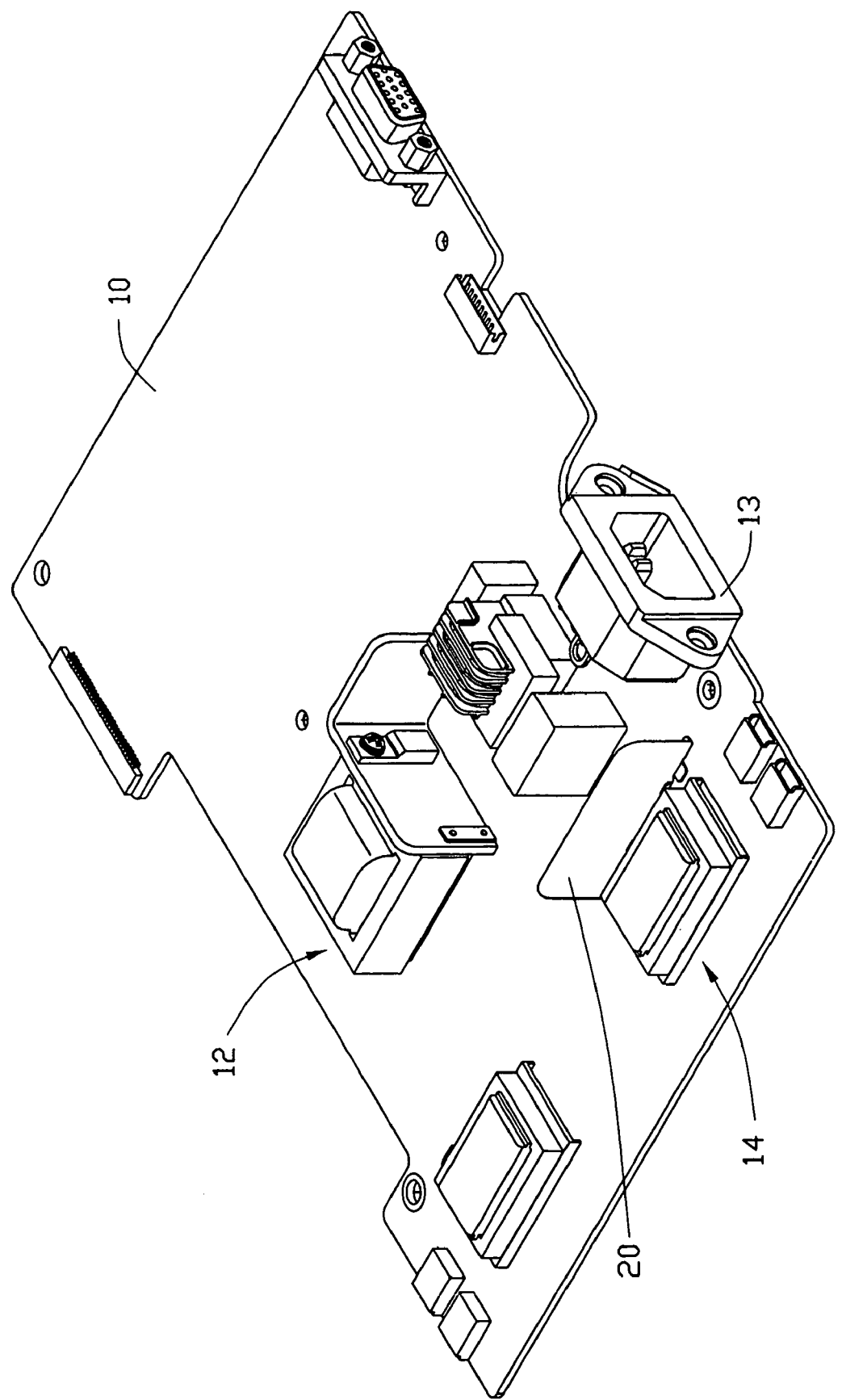
FIG. 3 is an assembled, isometric view of FIG. 2, showing the EMI shielding device inserted into the printed circuit board of the liquid crystal display device.

Referring to FIG. 3, during assembling, the first engaging portions 203 of the EMI shielding device 20 are inserted into the recesses 15 of the printed circuit board 10. Then the first engaging portions 203 of the EMI shielding device 20 and the printed circuit board 10 are advantageously metallurgically fastened, e.g., soldered or welded together. Alternatively, the first engaging portions 203 can be fixed in the printed circuit board 10 by other means, e.g., riveting, threaded fastener, etc. The second engaging portions 205 engage with the printed circuit board 10 firmly. Therefore, the EMI shielding device 20 is fixed on the printed circuit board 10, between the power supply 12 and the inverter 14 and near the interface board 13.

Because EMI produced by the integrated printed circuit board 10 is concentrated on an area between the power supply 12 and the inverter 14 and near the interface board 13, the EMI shielding device 20, as positioned, sized, and configured, can reduce or even avoid the occurrence of EMI. Furthermore, when the first engaging portions 203 of the EMI shielding device 20 extend into and thereby engage a grounding plane 17 of the printed circuit board 10, static electricity and/or other interference electricity can be lead to the grounding plane 17 via the EMI shielding device 20 and further be released to the external environment via the grounding plane 17. Thus, the liquid crystal display device can have good performance.

It is noted that the printed circuit board 10 can further have one or more additional EMI shielding devices 20 fixed between appropriate areas between the power supply 12 and the inverter 14 to even more effectively avoid the opportunity for EMI.

Finally, it is to be understood that the above-described embodiments are intended to illustrate rather than limit the invention. Variations may be made to the embodiments without departing from the spirit of the invention as claimed. The above-described embodiments illustrate the scope of the invention but do not restrict the scope of the invention.

I claim:

1. An Electro Magnetic Interference (EMI) shielding device, comprising:
   a body sized and configured for at least reducing an amount of electro magnetic interference that could potentially be generated by proximate components on a printed circuit board;
   at least a first engaging portion extending from and being spatially coplanar with the body, each first engaging portion being configured for insertion into the printed circuit board and engagement therewith; and
   a pair of second engaging portions extending from the body along a direction approximately perpendicular to the body, the second engaging portions and each first engaging portion being formed at a same side of the body.

2. The EMI shielding device as claimed in claim 1, wherein the first engaging portion is substantially formed in the middle of the body and extends downwardly therefrom.

3. The EMI shielding device as claimed in claim 1, wherein the first engaging portion is a hollow plate.

4. The EMI shielding device as claimed in claim 1, wherein the body is in the form of a sheet.

5. The EMI shielding device as claimed in claim 1, wherein the second engaging portions are respectively formed proximate opposite ends of the body.

6. The EMI shielding device as claimed in claim 1, wherein the second engaging portions are plates.

7. A liquid crystal display device, comprising:
   a printed circuit board with a power supply, an inverter and an interface board formed thereon, the printed circuit board having at least a recess defined between the power supply and the inverter and near the interface board; and
   a EMI shielding device including:
      a body sized and configured for at least reducing an amount of electro magnetic interference that could potentially be generated by the power supply, the inverter and the interface board;
      at least a first engaging portion extending from and being spatially coplanar with the body, each first engaging portion being inserted into the recess of the printed circuit board and engaged with the printed circuit board; and
      a pair of second engaging portions extending from the body along a direction approximately perpendicular to the body and being engaged with the printed circuit board.

8. The liquid crystal display device as claimed in claim 7, wherein each first engaging portion is substantially formed in the middle of the body and extends downwardly thereform.

9. The liquid crystal display device as claimed in claim 7, wherein each first engaging portion of the EMI shielding device and the printed circuit board are metallurgically attached to one another.

10. The liquid crystal display device as claimed in claim 7, wherein the first engaging portion is a hollow plate.

11. The liquid crystal display device as claimed in claim 7, wherein the body is in the form of a sheet.

12. The liquid crystal display device as claimed in claim 7, wherein the second engaging portions respectively are formed proximate opposite ends of the body.

13. The liquid crystal display device as claimed in claim 12, wherein the second engaging portions are plates.

14. The liquid crystal display device as claimed in claim 7, wherein the second engaging portions and the first engaging portion are arranged at a same side of the body.

15. The liquid crystal display device as claimed in claim 14, wherein the printed circuit board further comprises a grounding plane, the recess is defined in the grounding plane and whereby the EMI shielding device is engaged with the grounding plane.

16. The liquid crystal display device as claimed in claim 7, wherein the power supply, the inverter and the interface board all are formed on a single printed circuit board.

* * * * *